(12) United States Patent
Saito et al.

(10) Patent No.: US 7,750,574 B2
(45) Date of Patent: Jul. 6, 2010

(54) METHOD OF GENERATING DISCHARGE PLASMA

(75) Inventors: Takao Saito, Nagoya (JP); Tatsuya Terazawa, Kasugai (JP); Yoshimasa Kondo, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 527 days.

(21) Appl. No.: 11/653,833

(22) Filed: Jan. 17, 2007

(65) Prior Publication Data

US 2007/0175587 A1    Aug. 2, 2007

(30) Foreign Application Priority Data

Jan. 20, 2006    (JP)    ............... P2006-012264

(51) Int. Cl.
     *H05B 31/26*      (2006.01)
(52) U.S. Cl. .................. 315/111.21; 315/111.71; 315/291; 118/723 R; 118/723 ER; 118/723 E; 219/121.36; 219/121.41
(58) Field of Classification Search ............ 315/111.21, 315/111.71, 111.81, 291; 118/723 R, 723 MW, 118/723 ER, 723 E; 219/121.4, 121.15, 121.36, 219/121.41, 121.43; 428/938
See application file for complete search history.

(56) References Cited

U.S. PATENT DOCUMENTS

| | | | |
|---|---|---|---|
| 5,303,139 A | | 4/1994 | Mark |
| 5,968,377 A | * | 10/1999 | Yuasa et al. ............ 219/121.41 |
| 6,335,535 B1 | * | 1/2002 | Miyake et al. ......... 250/492.21 |
| 6,670,766 B2 | * | 12/2003 | Yamazaki et al. ...... 315/111.21 |
| 7,374,977 B2 | * | 5/2008 | Yamazaki et al. ........... 438/149 |
| 2001/0031543 A1 | | 10/2001 | Ando et al. |
| 2002/0008480 A1 | | 1/2002 | Yamazaki et al. |
| 2002/0040766 A1 | | 4/2002 | Takahashi et al. |
| 2003/0157378 A1 | * | 8/2003 | Mizuno et al. .............. 428/938 |
| 2004/0161534 A1 | | 8/2004 | Saito et al. |
| 2006/0157449 A1 | | 7/2006 | Takahashi et al. |
| 2008/0122368 A1 | * | 5/2008 | Saito et al. ............. 315/111.21 |

FOREIGN PATENT DOCUMENTS

| | | |
|---|---|---|
| JP | A 09-312280 | 12/1997 |
| JP | A-10-36537 | 2/1998 |
| JP | A 2000-124190 | 4/2000 |
| JP | A-2002-093768 | 3/2002 |

(Continued)

OTHER PUBLICATIONS

Saito et al., "High-Speed Synthesis of DLC Film by Using Bipolar Nanopulse Plasma Source", Proceedings of the 112$^{th}$ Meeting of the Society of Surface Technique, pp. 1-4, Oct. 5, 2005.

(Continued)

*Primary Examiner*—Haissa Philogene
(74) *Attorney, Agent, or Firm*—Oliff & Berridge PLC

(57) ABSTRACT

A pulse voltage is applied on a process gas to generate discharge plasma. The pulse voltage has a duty ratio controlled in a range of 0.001 percent or more and 8.0 percent or less. Preferably, the discharge plasma has an electron density of $1 \times 10^{10}$ cm$^{-3}$ or larger and an electron temperature of 1.5 eV or lower at a supplied power of 1.0 W/cm$^2$ or more per a unit area of a discharge electrode.

11 Claims, 3 Drawing Sheets

FOREIGN PATENT DOCUMENTS

| | | |
|---|---|---|
| JP | A-2002-316039 | 10/2002 |
| JP | A-2003-306769 | 10/2003 |
| JP | A-2004-103423 | 4/2004 |
| JP | A-2004-217975 | 8/2004 |
| JP | A 2004-270022 | 9/2004 |
| JP | B2 3639795 | 4/2005 |
| JP | A-2005-124396 | 5/2005 |
| JP | A 2005-159049 | 6/2005 |
| JP | A-2005-209360 | 8/2005 |
| JP | A-2005-272957 | 10/2005 |
| JP | B2 3705977 | 10/2005 |

OTHER PUBLICATIONS

Saito et al., "High-Speed Synthesis of DLC Film by Using Bipolar Nanopulse Plasma Source", Proceedings of the 112$^{th}$ Meeting of the Society of Surface Technique, slides 1-14, Oct. 5, 2005.

Saito et al., "Evaluation of Nanopulse Plasma and its Application to DLC Film Deposition", Proceedings of the Division Conference of the Institute of Electrical Engineers of Japan, pp. 1-13, Aug. 22, 2005.

Saito et al., "Evaluation of Nanopulse Plasma and its Application to DLC Film Deposition", Proceedings of the Division Conference of the Institute of Electrical Engineers of Japan, slides 1-25, Aug. 22, 2005.

Mar. 9, 2010 Office Action issued in Japanese Patent Application No. 2006-012264 (with translation of essential parts).

* cited by examiner

METHOD OF GENERATING DISCHARGE PLASMA

BACKGROUND OF THE INVENTION

1. Field of the Invention

The present invention provides a method of generating discharge plasma.

2. Related Art Statement

According to Japanese patent publication No. 2004-270022A, a nano-pulse electric power source having a pulse width of 1000 nsec or smaller is used to form a diamond-like carbon film under atmospheric pressure.

Japanese patent publication No. H09-312280A disclosed that pulse discharge is maintained at an off-time of pulse discharge of 0.5 µs to 30 µs. The duty ratio of the pulse voltage is as large as 10 percent or higher and so-called microwave (high frequency wave of 2.45 GHz) is converted to pulse wave.

According to Japanese patent No. 3705977B, the modulation period is made 10 to 500 µs and the duty ratio is made 10 to 80 percent. Also according to this method, as a source for generating plasma, high frequency wave of 0.4 to 13.56 MHz is converted to pulse wave for use in etching process.

According to Japanese patent publication No. 2005-159049A, the repetition period of high frequency is made 10 to 100 kHz and the duty ratio is made 40 to 60 percent for generating plasma for use in film formation.

Japanese patent publication No. 2000-124190A disclosed a plasma source having an electron temperature of 0.25 to 1 eV utilizing microwave (0.3 to 1 GHz) as the plasma source.

According to Japanese patent No. 3639795A, pulses having different polarities are superimposed to supply electric power to obtain plasma having an electric temperature of 3 eV or lower and density of $2 \times 10^8$ cm$^{-3}$ or lower. The off-time of the pulse is not, however, controlled and the electron density is very low.

SUMMARY OF THE INVENTION

It is necessary and indispensable plasma of a high electron density in deposition of thin film, etching and implantation process of impurities. Further, plasma of a low electron temperature has been attracted an attention for controlling film quality and for reducing damage on a substrate in plasma atmosphere. It is, however, difficult to generate and maintain discharge plasma having a high electron density and a low electron temperature.

An object of the present invention is to provide a method of generating discharge plasma for improving the electron density and for lowering the electron temperature of discharge plasma.

The present invention provides a method of generating plasma: the method comprising the step of applying a pulse voltage on a process gas, wherein said pulse voltage has a duty ratio of 0.001 percent or higher and 8.0 percent or lower.

According to prior arts, generally, a high frequency voltage source has been converted to pulse voltage source to generate plasma. It has, therefore, not been an example of controlling the off-time of the pulse so that the duty ratio of the pulse is high in either of the arts. It is considered that the voltage source of a type of converting high voltage source to pulse voltage provides the pulse of a high duty ratio.

The present inventors have tried to considerably lower the duty ratio of the pulse voltage for generating and maintaining the discharge plasma and increase the off-time of the pulse. It is thus found that the electron temperature of the plasma can be considerably lowered under the condition that the electron density can be maintained at a high value, and the present invention is made.

PREFERRED EMBODIMENTS FOR CARRYING OUT THE INVENTION

Figure 1:
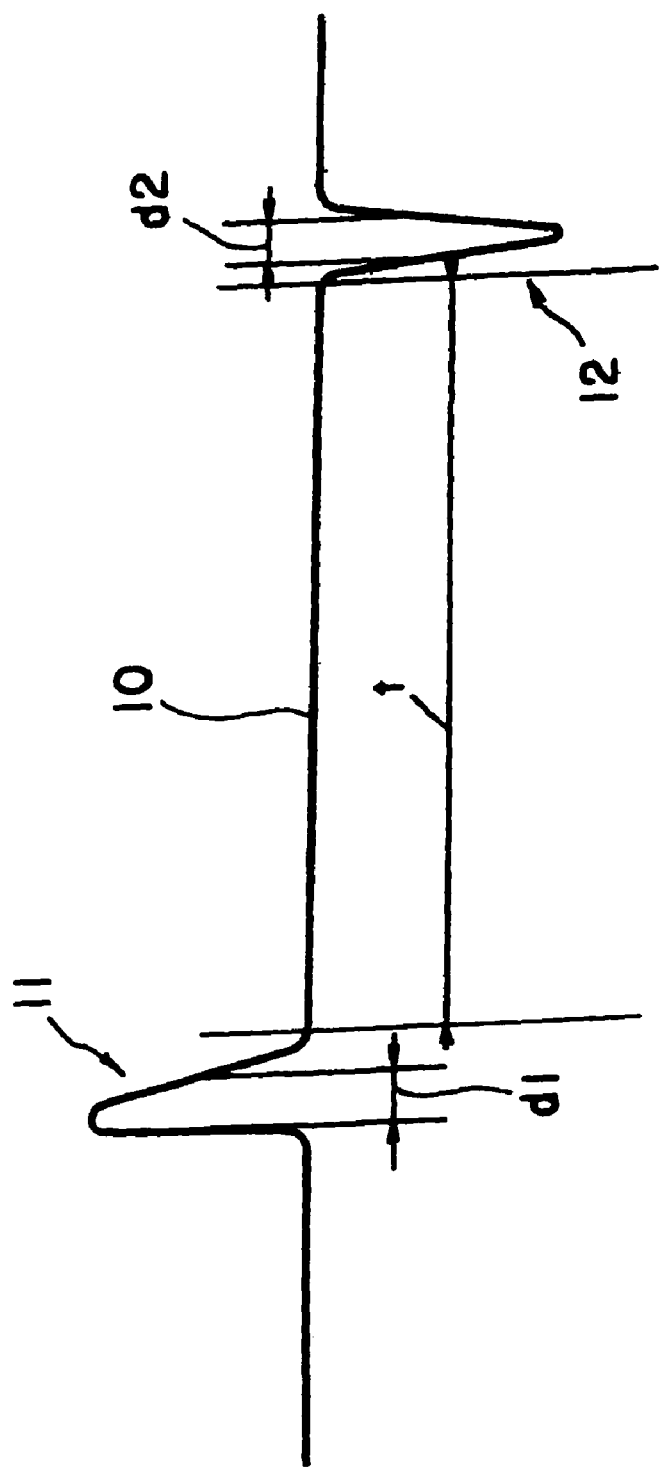
FIG. 1 is a schematic view showing an example of negative and positive pulses.

According to the present invention, the duty ratio of the pulse voltage is controlled in a range of 0.001 percent or high and 8.0 percent or lower. By controlling the duty ratio at 8.0 percent or lower, the electron temperature of the discharge plasma can be lowered, while the electron density can be maintained at a high value. On the viewpoint of the present invention, the duty ratio may preferably be 5 percent or lower, more preferably be 3 percent or lower and most preferably be 1 percent or lower. It is practically difficult to make the duty ratio lower than 0.001 percent.

The duty ratio of the pulse voltage is represented by the following formula.

Duty ratio (%)=(Total of on-time(s) of the pulse/pulse period)×100

"On-time(s) of the pulse" means a time from the start of rising of the pulse to the end of the pulse.

"Total of on-time of the pulse" means a sum of all of the on-time(s) of pulse(s) included in a single period.

For example, when it is applied a positive pulse having a period of 1000 µsec and an on-time of 1 µsec, the duty ratio is (1 µsec/1000 µsec)×100=0.1%.

In the case that one positive pulse and one negative pulse are included in a single period, the total of the on-time of the positive pulse and the on-time of the negative pulse is divided by the single period. For example, in the case that a positive pulse having an on-time of 1 µsec and a negative pulse having an on-time of 2 µsec are applied in a period of 1000 µsec, the duty ratio is (1 µsec+2 µsec)/1000 µsec=0.3%.

According to the present invention, at a supply power per an unit area of a discharge electrode of 1.0 W/cm$^2$ or more, the electron density of the discharge plasma can be made $1 \times 10^{10}$ cm$^{-3}$ or more and more preferably be made $5 \times 10^{10}$ cm$^{-3}$ or more. Further, the electron temperature of the discharge plasma can be made 1.5 eV or lower and more preferably be 1.0 eV or lower.

Although the discharge plasma is glow discharge plasma according to a preferred embodiment, the discharge plasma may be hollow cathode discharge, streamer discharge or arc discharge.

Although the frequency of the pulse voltage is not particularly limited, the frequency may preferably be 0.1 kHz or higher and 100 kHz or lower.

Although the pressure of the process gas is not limited, the present invention is most effective for a process of generating discharge plasma under a low pressure condition. On the viewpoint, the pressure of the process gas may preferably be 100 Pa or lower and more preferably be 50 Pa or lower. The lower limit of the pressure is not particularly limited.

According to the present invention, it is particularly preferred to apply at least one of the positive and negative pulses. It is thus possible to form, for example, a thin film at a high efficiency. In this case, each of patterns of application of the positive and negative pulses is not particularly limited. A plurality of the positive pulses may be continuously applied, or a plurality of the negative pulses may be continuously applied.

According to the present invention, the half value width of the pulse (each half value width of each of the positive and negative pulses in the case of a bipolar pulse) may preferably be 3000 nsec or lower and more preferably be 1000 nsec or lower. It is thus possible to improve the electron density of the discharge plasma. For example, in the case of a pulse voltage wave form 10 shown in FIG. 1, the positive pulse 11 and negative pulse 12 are applied alternately at a specific interval. "d1" represents a half value width of the positive pulse 11 and "d2" represents a half value width of the negative pulse 12.

Although the magnitude of the positive pulse 11 is not particularly limited, the electric field intensity between the opposing electrodes may preferably be 0.01 to 100 kV/cm and more preferably be 0.1 to 50 kV/cm.

Although the magnitude of the negative pulse 12 is not particularly limited, the electric field intensity between the opposing electrodes may preferably be −0.01 to −100 kV/cm and more preferably be −0.1 to −50 kV/cm.

According to the present invention, plasma is generated in a space between opposing electrodes. A dielectric material may be provided on at least one of the opposing electrodes, or a metal electrode may be exposed to the outside. The opposing electrodes may be of plane parallel plate type, cylinder parallel plate type, sphere parallel plate type, hyperbola parallel plate type, or coaxial cylinder type.

Either or both of the opposing electrodes may be covered with a solid dielectric material. Such solid dielectric material includes plastics such as polytetrafluoroethylene, polyethyleneterephthalate etc., a metal oxide such as a glass, silicon dioxide, aluminum oxide, zirconium dioxide, titanium dioxide etc., and a composite oxide such as barium titanate etc.

The thickness of the dielectric material may preferably be 0.05 to 4 mm. A distance between the opposing electrodes is not particularly limited, and may preferably be 1 to 500 mm. The substrate may be made of a material including plastics such as polyethylene, polypropylene, polystyrene, polycarbonate, polyethylene terephthalate, polyphenylene sulfide, polyether ether ketone, polytetrafluoroethylene, an acrylic resin etc., a glass, a ceramic material and a metal. The shape of the dielectric material is not particularly limited, and may be a plate, film or various kinds of three-dimensional shapes.

According to the present invention, a pulse voltage is applied on the opposing electrodes to generate plasma. The wave form of each of the positive and negative pulses is not particularly limited, and may be of impulse, square wave (rectangular wave), or modulated wave type. A direct current bias voltage may be applied with the application of the pulse voltage.

Figure 2:
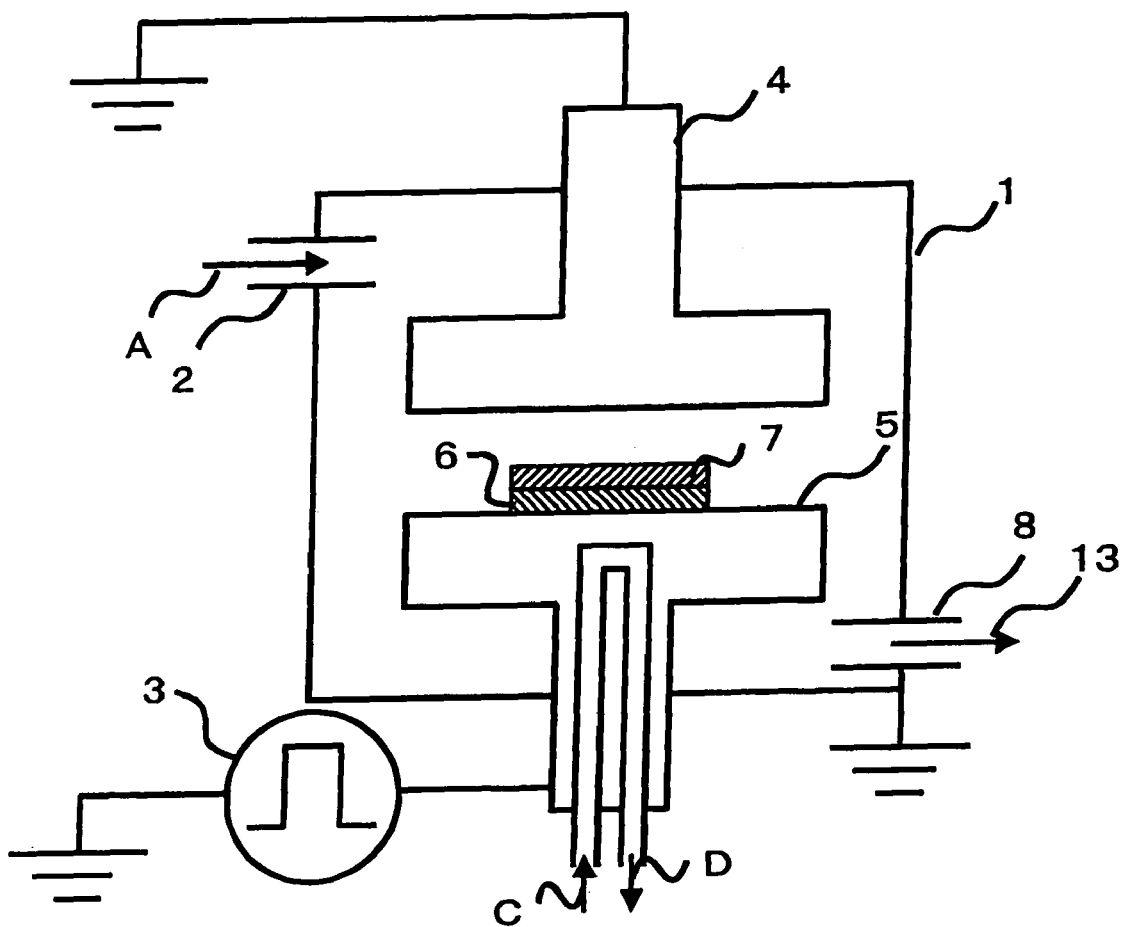
FIG. 2 is a diagram showing a film-forming system for use in carrying out the present invention.

FIG. 2 is a diagram schematically showing a system usable for carrying out the present invention. Discharge plasma is generated in a chamber 1. A substrate 6 is mounted on a lower electrode 5 and opposes an upper electrode 4 to form a space between them, where discharge plasma is generated. A gaseous raw material is supplied from a gas supply hole 2 of the chamber 1 as an arrow A into the chamber 1. A pulse voltage including negative and positive pulses is applied on the electrodes by means of an electric source 3 utilizing a static induction thyristor device to generate plasma. Used gas is exhausted from a discharge exhaust hole 8 as an arrow B. A communicating route 9 of a cooling medium is formed in the lower electrode 5, so that the cooling medium is flown in the communicating route 9 as arrows C and D. It is thus possible to control the temperature of the substrate 6 at a specific value of, for example, 20 to 300° C.

The gaseous raw material may be supplied into the chamber 1 after mixing. Alternatively, when the gaseous raw material includes two or more kinds of gases and a dilution gas, each of the gases gas may be supplied into the chamber 1 through the corresponding separate supply holes, respectively.

The pulse voltage can be applied with an electric source for generating pulse with a short rise time. Such electric source includes a source using a static induction thyristor device without the need of a mechanism for magnetic pressure, or a source using a thyratron equipped with a mechanism for magnetic pressure, a gap switching device, IGBT device, MOF-FET device, or a static induction thyristor device.

The plasma generated according to the present invention may be applied to various methods such as thin film forming process, etching process, sputtering process or the like. Further, the plasma generated according to the present invention is suitable for generating process gas containing radicals for use in remote plasma process.

Objects to be processed by the plasma generated according to the present invention is not particularly limited. Methods of surface treatment of the substrate will be described in detail.

The object to be processed includes plastics such as polyethylene, polypropylene, polystyrene, polycarbonate, polyethylene terephthalate, polytetrafluoroethylene, an acrylic resin etc., a glass, a ceramic material and a metal. Although the shape of the substrate includes a plate, film or the like, it is not limited to these materials. According to the surface treatment methods according to the present invention, it is possible to easily respond to the processing of materials having various shapes.

By using a gaseous fluorine-containing compound as the process gas, a fluorine-containing group can be formed on the surface of the substrate to lower the surface energy and to obtain hydrophobic surface.

The fluorine-containing compound includes fluorocarbon compounds such as tetrafluorocarbon (CF4), hexafluorocarbon (C2F6), propylenehexafluoride (CF3CFCF2), cyclobutaneoctafluoride (C4F8) and the like, halogen-carbon compounds such as carbon chloride trifluoride (CClF3), and fluorine-sulfur compounds such as sulfur hexafluoride (SF6) and the like.

The following oxygen atom containing compounds, nitrogen atom containing compounds or sulfur atom containing compounds may be used as the process gas to form a hydrophilic functional group such as carbonyl group, hydroxyl group, amino group or the like on the surface of the substrate to improve the surface energy and to obtain a hydrophilic surface.

The oxygen containing compounds include oxygen, ozone, water, carbon monoxide, carbon dioxide, nitrogen monoxide, nitrogen dioxide, as well as organic compounds containing oxygen atom including alcohols such as methanol, ethanol and the like, ketones such acetone, methyethyl ketone and the like, and aldehydes such as methanal, ethanal and the like. They can be used alone or in combination. Further, the above oxygen atom containing compound and the gas of a hydrocarbon compound such as methane, ethane and the like may be mixed before use. Further, the fluorine containing compound may be added to the above oxygen atom containing compound in an amount of 50 volume percent or lower of the oxygen containing compound to provide hydrophilic property. Such fluorine containing compound may be selected from those listed above.

The nitrogen atom containing compound includes nitrogen, ammonia and the like. The above nitrogen containing compound and hydrogen may be mixed and used.

The sulfur atom containing compounds include sulfur dioxide, sulfur trioxide and the like. Further, sulfuric acid may be vaporized and used. These may be used alone or in combination.

Further, a chlorine atom containing compound ($Cl_2$, HCl, $PCl_3$, $BCl_3$ and the like) may be used.

It is also possible to deposit a hydrophilic polymer film by performing the processing under atmosphere of a monomer having a hydrophilic group and polymerizable unsaturated bond therein. The hydrophilic group includes a hydrophilic group such as hydroxide group, sulfonic acid group, sulfonate group, primary, secondary or tertially amino group, amide group, quartary ammonium group, carboxylic acid group, carboxylate group or the like. Further, a hydrophilic polymer film can be similarly deposited using a monomer having a polyethylene glycol chain.

The monomer includes acrylic acid, methacrylic acid, acrylamide, methacrylamide, N,N-dimethyl acrylamide, sodium acrylate, sodium methcrylate, potassium acrylate, potassium methacrylate, sodium styrene sulfonate, allyl alcohol, allyl amine, polyethylene grycol dimethacrylate ester, polyethylene glycol diacrylate ester and the like. These monomers may be used alone or in combination.

Since the hydrophilic monomers are generally solid, the monomer is dissolved in a solvent and vaporized by means of reducing pressure before use. The solvent includes an organic solvent such as methanol, ethanol, acetone or the like, water and the mixtures thereof.

Further, process gas may be used to form a thin film of a metal oxide such as $SiO_2$, $TiO_2$, $SnO_2$ or the like to provide electrical and optical functions on the substrate surface. The process gas includes a metal-hydrogen compound, a metal-halogen compound and a metal alcoholate or the like of a metal such as Si, Ti, Sn or the like.

The processing may preferably be performed in an atmosphere diluted with a dilution gas as follows. The dilution gas includes an inert gas such as helium, neon, argon, xenon, krypton or the like, nitrogen, hydrogen, oxygen or the like. They may be used alone or in combination. Further, in the case that the dilution gas is used, the ratio of the process gas may preferably be 1 to 10 volume percent.

According to the inventive method, stable processing can be realized in argon, nitrogen, hydrogen or oxygen gas. Particularly, the present invention is epoch-making in that various kinds of remote plasma processes can be realized using atmosphere containing 70 percent or more of hydrogen as the process gas.

The following gas may be further used.

(Gaseous Raw Material Including Carbon Source)

An alcohol such as methanol, ethanol or the like.

An alkane such as methane, ethane, propane, butane, pentane, hexane or the like.

An alkene such as ethylene, propylene, betene, pentene or the like.

An alkadiene such as pentadiene, butadiene or the like.

An alkyne such as acetylene, methyl acetylene or the like.

An aromatic hydrocarbon such as benzene, toluene, xylene, indene, naphthalene, phenanthrene or the like.

A cycloalkane such as cyclopropane, cyclohexane or the like.

A cycloalkene such as cyclopentene, cyclohexene or the like.

The content of the carbon source in the gaseous raw material may preferably be 2 to 80 vol. % in an application of forming a film containing carbon.

The content of oxygen gas or hydrogen gas in the gas atmosphere may preferably be 70 vol. % or lower.

The dilution gas may be at least one of gases of nitrogen and elements belonging to the group VIII of the Periodic Table, such as helium, argon, neon and xenon. The content of the dilution gas in the atmosphere of gaseous raw material may preferably be 20 to 90 vol. %.

Further, a gas containing boron element or phosphorus element such as diborane ($BH_3BH_3$), trimethyl boron ($B(CH_3)_3$), phosphine ($PH_3$), methyl phosphine ($CH_3PH_2$) or the like, or nitrogen gas may be added to gas atmosphere where the discharge occurs.

The thin film produced by the present invention may be composed of diamond like carbon. Alternatively, the thin film may be an amorphous silicon film (a-Si:H), or an amorphous or a crystal film of BCN, BN, CN, cBN, diamond or the like.

EXAMPLES (Experiment 1)

Figure 3:
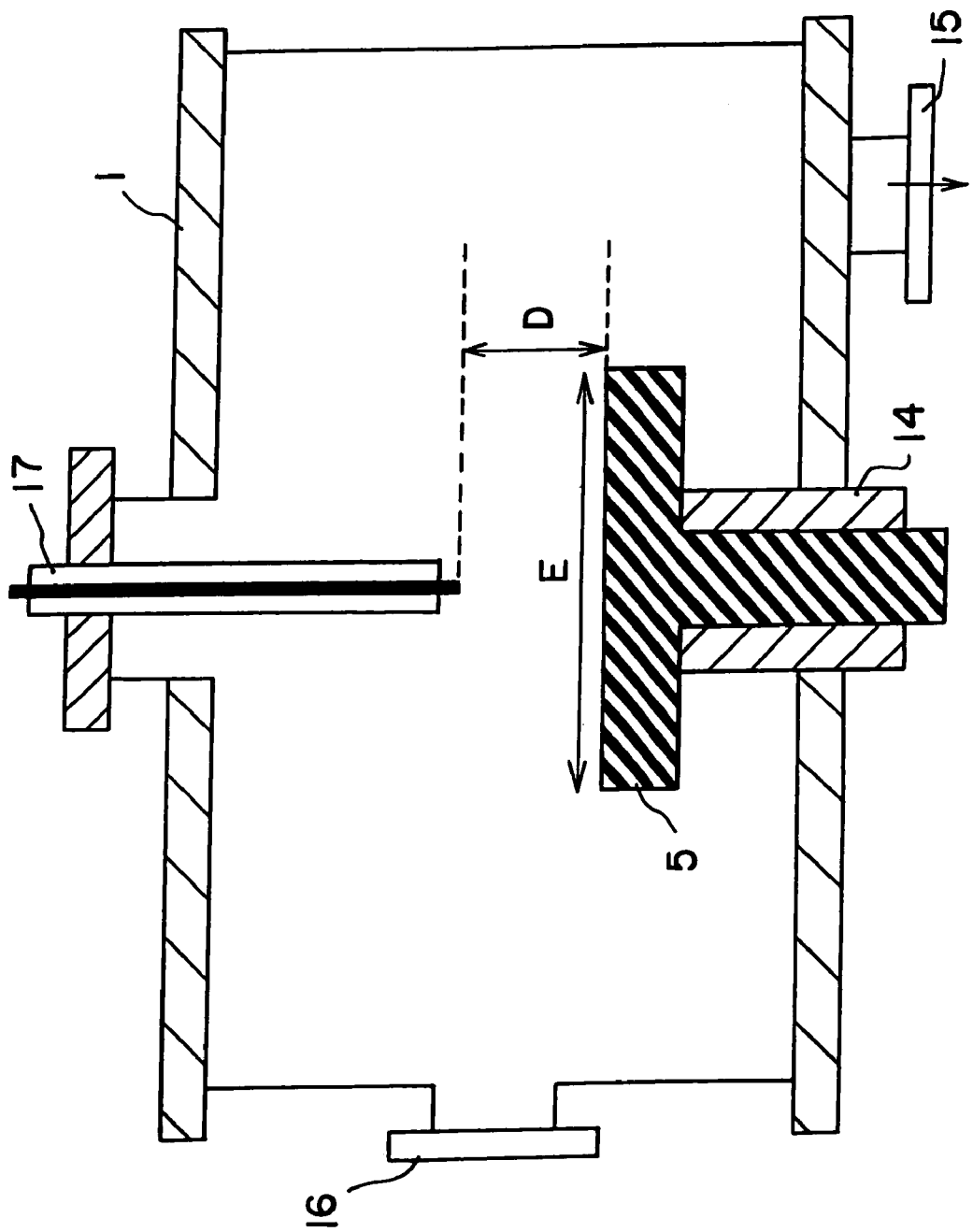
FIG. 3 is a diagram schematically showing a system for use in the plasma generation method of the present invention.

The system explained referring to FIG. 3 was used to generate glow discharge and plasma. A chamber 1 was made of stainless steel and substantially had a shape of a disk. The height of the chamber was 300 mm and the diameter φ was 300 mm. The chamber 1 was equipped with a view window 16, a Langmuir probe 17 and an electrode 5 made of stainless steel. The electrode 5 and the chamber 1 were insulated with an insulator 14. The height "D" of the probe was made 60 mm and the diameter "E" of the electrode 5 was made 100 mm. A power source using a static induction thyristor device was used as a power source.

A rotary pump and a turbo molecular pump were used to evacuate the chamber 1 until the pressure of argon gas in the chamber 1 reached 2.6 Pa. Positive pulses were periodically applied. The positive pulse had a peak value of +10.0 kV and a frequency of 1 to 10 kHz. The half value width of the positive pulse was 1000 nsec. The duty ratio of the pulse voltage was variously changed as shown in table 1.

Further, an experiment was performed under the condition that only negative pulses were periodically applied. The negative pulse had a peak value of −10 kV and a frequency of 1 to 10 kHz. The half value width of the negative pulse was 1000 nsec. The duty ratio of the pulse voltage was variously changed as shown in table 1.

As a reference example, the chamber shown in FIG. 3 was used and a high frequency voltage having a frequency of 13.56 MHz was continuously applied instead of the pulse voltage described above. The value of high frequency voltage Vpp was made 1000 V. Vpp represents a difference of the maximum voltage value and the minimum voltage value. Since the voltage was continuously applied, the duty ratio was 100 percent. For each example, the electron density and the electron temperature of plasma were measured by Langmuir probe method.

TABLE 1

| Experiment | Duty ratio of pulse Voltage (%) | Pulse Polarity | Supplied power (W/cm$^2$) | Electron density × 10$^{10}$ cm$^{-3}$ | Electron temperature (eV) |
|---|---|---|---|---|---|
| 1-1 | 0.1 | Positive Pulse | 0.8 | 5.0 | 1.0 |
| 1-2 | 0.1 | Positive Pulse | 1.0 | 10.0 | 0.5 |
| 1-3 | 0.5 | Positive Pulse | 1.8 | 28.0 | 0.4 |
| 1-4 | 1.0 | Positive Pulse | 2.5 | 37.8 | 0.3 |
| 1-5 | 0.1 | Negative Pulse | 0.8 | 0.8 | 2.0 |
| 1-6 | 0.1 | Negative Pulse | 1.0 | 1.1 | 1.0 |
| 1-7 | 0.5 | Negative Pulse | 1.8 | 2.4 | 0.9 |
| 1-8 | 1.0 | Negative Pulse | 2.5 | 4.8 | 0.8 |

As can be seen from the results, according to the present invention, it is possible to generate discharge plasma having a high electron density and a low electron temperature at a supply power per an unit area of the discharge electrode of 1.0 W/cm$^2$ or more.

(Experiment 2)

The system explained referring to FIG. 2 was used to produce a thin film of diamond-like carbon, as described above. A chamber 1 was made of stainless steel and substantially had a shape of a disk. The height of the chamber was 300 mm and the diameter φ was 300 mm. A power source using a static induction thyristor device was used as a power source.

An rotary pump and an oil diffusion pump were used to evacuate the chamber 1 until a pressure in the chamber 1 reached 1×10$^{-2}$ to 1×10$^{-3}$ Pa. Acetylene gas was then supplied into the chamber 1 through a supply hole until the pressure in the chamber reached 2.6 Pa. Pulse voltage was then applied on the upper electrode 4 and the lower electrode 5.

Positive pulses 11 and negative pulses 12 were periodically and alternately applied. The positive pulse 11 had a peak value of +10.0 kV and the negative pulse 12 had a peak value of −10.0 kV. The positive pulse had a frequency of 1 to 5 kHz and the distance "t" between the positive and negative pulses was 20.0 μsec. The positive pulse 11 had a half value width "d1" of 150 nsec and the negative pulse 12 had a half value width "d2" of 200 nsec. The duty ratio of the pulse voltage was variously changed as shown in table 2. The pulse voltage was applied to maintain discharge for 60 minutes to form a thin film 7 of diamond-like carbon. The film-forming rate in each example was shown in table 2.

TABLE 2

| Experiment | Duty ratio of Pulse voltage (%) | Supplied power (W/cm$^2$) | Film-forming rate (μm/hour) |
|---|---|---|---|
| 2-1 | 0.03 | 1.0 | 1.2 |
| 2-2 | 0.05 | 1.2 | 1.8 |
| 2-3 | 0.07 | 1.4 | 2.5 |
| 2-4 | 0.07 | 1.5 | 3.0 |
| 2-5 | 0.10 | 1.6 | 3.5 |
| 2-6 | 0.12 | 1.9 | 3.8 |
| 2-7 | 0.14 | 2.2 | 4.3 |
| 2-8 | 0.14 | 2.5 | 5.0 |

In the experiment Nos. 2-1 to 2-8 in table 2, the thus obtained film was subjected to (measured by ?) Raman spectroscopic analysis using a system for Raman spectroscopy (supplied by JASCO Corporation: "NRS-1000"). As a result, peaks of wave numbers of about 1360 and about 1580 cm$^{-1}$ were observed due to scattering corresponding with diamond-like carbon. It was thus proved that diamond-like carbon film was formed. Moreover, according to the present invention, it was proved that the film-forming rate was considerably improved.

The invention claimed is:

1. A method of generating discharge plasma by applying a pulse voltage on a process gas,
    wherein
    said pulse voltage comprises an impulse-type wave form and a duty ratio controlled in a range of 0.001 percent or more and 8.0 percent or less; and
    said discharge plasma comprises an electron density of 1×10$^{10}$ cm$^{-3}$ or larger at a supplied power of 1.0 W/cm$^2$ or more per a unit area of a discharge electrode.

2. The method of claim 1, wherein said discharge plasma comprises an electron temperature of 1.5 eV or less at a supplied power of 1.0 W/cm$^2$ or more per a unit area of a discharge electrode.

3. The method of claim 1, wherein said pulse voltage has a pulse width of 3000 nsec or smaller.

4. The method of claim 1, wherein said discharge plasma comprises a glow discharge plasma.

5. The method of claim 1, wherein said pulse voltage has a period of 0.1 kHz or more and 100 kHz or less.

6. The method of claim 1, wherein said process gas has a pressure of 100 Pa or lower.

7. The method of claim 1, wherein said process gas with said discharge plasma generated is used a plasma source and said process gas is contacted with a substrate to form a thin film thereon.

8. The method of claim 1, wherein said process gas with said discharge plasma generated is used to perform dry etching.

9. The method of claim 1, wherein said process gas with said discharge plasma generated is used to perform sputtering.

10. The method of claim 1, wherein said process gas with said discharge plasma generated is used to perform implantation of an impurity in a semiconductor process.

11. A method of generating discharge plasma by applying a pulse voltage on a process gas, wherein said pulse voltage comprises a duty ratio controlled in a range of 0.001 percent or more and 8.0 percent or less,
    wherein said discharge plasma comprises an electron density of 1×10$^{10}$ cm$^{-3}$ or larger and an electron temperature of 1.5 eV or lower at a supplied power of 1.0 W/cm$^2$ or more per a unit area of a discharge electrode.

* * * * *